(12) United States Patent
Lin et al.

(10) Patent No.: US 11,770,977 B2
(45) Date of Patent: Sep. 26, 2023

(54) SEMICONDUCTOR STRUCTURE AND METHOD FOR FORMING THE SAME

(71) Applicant: TAIWAN SEMICONDUCTOR MANUFACTURING COMPANY LTD., Hsinchu (TW)

(72) Inventors: Jiann-Horng Lin, Hsinchu (TW); Kun-Yi Li, Hsinchu (TW); Han-Ting Lin, Hsinchu (TW); Huan-Just Lin, Hsinchu (TW); Chen-Jung Wang, Hsinchu (TW); Sin-Yi Yang, Taichung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 185 days.

(21) Appl. No.: 17/081,742

(22) Filed: Oct. 27, 2020

(65) Prior Publication Data

US 2022/0131070 A1 Apr. 28, 2022

(51) Int. Cl.
*H10N 50/10* (2023.01)
*G11C 11/16* (2006.01)
*H10B 61/00* (2023.01)
*H10N 50/01* (2023.01)
*H10N 50/80* (2023.01)

(52) U.S. Cl.
CPC .......... *H10N 50/10* (2023.02); *G11C 11/161* (2013.01); *H10B 61/00* (2023.02); *H10N 50/01* (2023.02); *H10N 50/80* (2023.02)

(58) Field of Classification Search
CPC ....... H01L 43/08; H01L 27/222; H01L 43/02; H01L 43/12; G11C 11/161; H10N 50/10; H10N 50/01; H10N 50/80; H10B 61/00
See application file for complete search history.

(56) References Cited

U.S. PATENT DOCUMENTS

| | | | |
|---|---|---|---|
| 2007/0081279 A1* | 4/2007 | Hong | G01R 33/093 360/324.1 |
| 2013/0034917 A1* | 2/2013 | Lee | H01L 43/12 257/E43.006 |
| 2015/0255507 A1* | 9/2015 | Pakala | H01L 43/08 257/421 |
| 2015/0263272 A1* | 9/2015 | Tomioka | H01L 43/12 156/345.31 |
| 2019/0165256 A1* | 5/2019 | Tien | H01L 23/5226 |
| 2020/0217735 A1* | 7/2020 | Mehta | G01L 1/125 |
| 2021/0288242 A1* | 9/2021 | Yogendra | H01L 43/08 |

* cited by examiner

*Primary Examiner* — Shih Tsun A Chou
(74) *Attorney, Agent, or Firm* — WPAT LAW; Anthony King (57) ABSTRACT

A method for fabricating magnetic tunnel junction (MTJ) pillars is provided. The method includes following operations. A MTJ stack of layers including a first magnetic layer, a tunnel barrier layer overlying the first magnetic layer, and a second magnetic layer overlying the tunnel barrier layer is provided. A first patterning step is carried out by using a reactive ion etching. In the first patterning step, the second magnetic layer and the tunnel barrier layer are etched to form one or more pillar structures and a protection layer is formed and covers sidewalk of the pillar structures.

20 Claims, 9 Drawing Sheets

SEMICONDUCTOR STRUCTURE AND
METHOD FOR FORMING THE SAME

BACKGROUND

Memory devices include a range of device types that utilize electronic memory, such as hard disk drives or random-access memory (RAM). With increasing use of portable computing devices and wireless communication devices, there is a need for memory devices featuring greater density, lower power consumption, and/or non-volatile properties. Magnetic memory devices may be able to satisfy the aforementioned technical requirements.

One type of data-storing mechanism for a magnetic memory device is a magnetic tunnel junction (MD) using a tunnel magneto resistance (TMR) effect. Magnetic tunnel junctions (MTJs) can be used in hard disk drives and/or RAM, and thus are promising candidates for next-generation memory solutions. However, for a magnetic memory device to provide reliable data storage, a low short rate must be realized.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF THE
DISCLOSURE

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

A semiconductor memory device, such as a magnetic random-access memory (MRAM) device, may include an array of densely-packed MRAM cells. In each MRAM cell, a data-storage element, such as a magnetic tunneling junction (MTJ) element, may be integrated with a transistor to perform write and read operations. The MTJ element may be referred to as a MTJ stack. The MTJ stack may be disposed between a bottom electrode and a top electrode. The MTJ stack includes a reference layer and a free layer separated by a tunnel barrier layer. The reference layer has a fixed magnetization direction, while the free layer has a variable magnetization direction. A performance of the MTJ stack is measured by a magnetoresistance (MR) ratio and a resistance area (RA) product. The MR ratio is a ratio of ($R_{ap}-R_p$)/$R_p$, where $R_{ap}$ is the resistance measured when the magnetizations of the reference layer and the free layer are anti-parallel (AP state) and $R_p$ is the resistance measured when the magnetizations of the reference layer and the free layer are parallel (P state). The RA product is the resistance $R_p$ times the area, where the area is the cross-sectional area of the MTJ stack. The MTJ stack is designed to have a high MR ratio and a low RA product for data storage purpose.

In order to reduce power consumption and increase the capacity of data storage as compared to the existing semiconductor memory technologies, such as SRAM and DRAM, MTJs in a MRAM device are fabricated in the form of nanopillars, and preferably, are scaled down to 40 nm or below. An important step in fabricating MTJ nanopillars is patterning the MTJ stack by etching. As the dimension decreases, the structure damage to the "edge" or sidewall regions of the MTJ nanopillar during an etching process becomes more pronounced, which may greatly affect critical device properties such as MR ratio and RA product. Furthermore, the MTJ stack includes a variety of materials (magnetic alloys, non-magnetic metals, and dielectric films), the etched material may be redeposited on the sidewall of the MTJ nanopillar and thus decreases the MR ratio and cause a device short failure. The MTJ etching may be carried out by a reactive ion etching (RIE) and/or an ion beam etching (IBE), and in some embodiments, a protection layer is formed on the sidewall of the etched structure before further etching the underlying layers.

In the RIE, chemical substance, such as methanol, is used to provide a chemically reactive plasma component for chemical etching. The chemically reactive plasma with high-energy ions is generated under low pressure by an electromagnetic field. The high-enemy ions from the plasma attack the surface of the material and react with it. The RIE causes chemical damage on MTJ nanopillar sidewalls and thus affects the efficiency of the device. The IBE uses a beam of positive charged ions, e.g. argon ion (Ar+), to physically etch the material by ion bombardment. Although the IBE does not cause chemical damage as the RIE, it may result in a high degree of redeposited material on MTJ nanopillar sidewalls. When metal, such as tantalum (Ta), is redeposited on the tunnel barrier, shorting may easily occur and render the device unusable. In addition, since the tunnel barrier is thin, chemical damage or damage from ion bombardment may affect the performance of the device.

The present disclosure therefore provides a method for fabricating magnetic tunnel junction (MTJ) pillars. In the method for forming fabricating magnetic tunnel junction (MTJ) pillars, an RIE with specific chemical substance is used to etch the tunnel barrier layer and the magnetic layer overlying the tunnel barrier layer and the etched material reacts with the chemical substance and forms a protection layer covering at least sidewalls of tunnel barrier layer during the RIE. The protection layer not only prevents the tunnel barrier layer from either chemical damage or damage from ion bombardment, but also functions as an insulation layer isolating the tunnel barrier layer from metal redeposition that may occur during etching underlying layers. Therefore, the shorting issue can be mitigated and the performance of the MTJ stack is improved.

FIGS. 1 through 8 show cross-sectional views of a semiconductor structure 800 including magnetic tunnel junction (MTJ) pillars at various stages of fabrication in accordance with some embodiments of the present disclosure. The operations shown in FIGS. 1 through 8 are also reflected schematically in the flowchart shown in FIG. 9.

Figure 1:
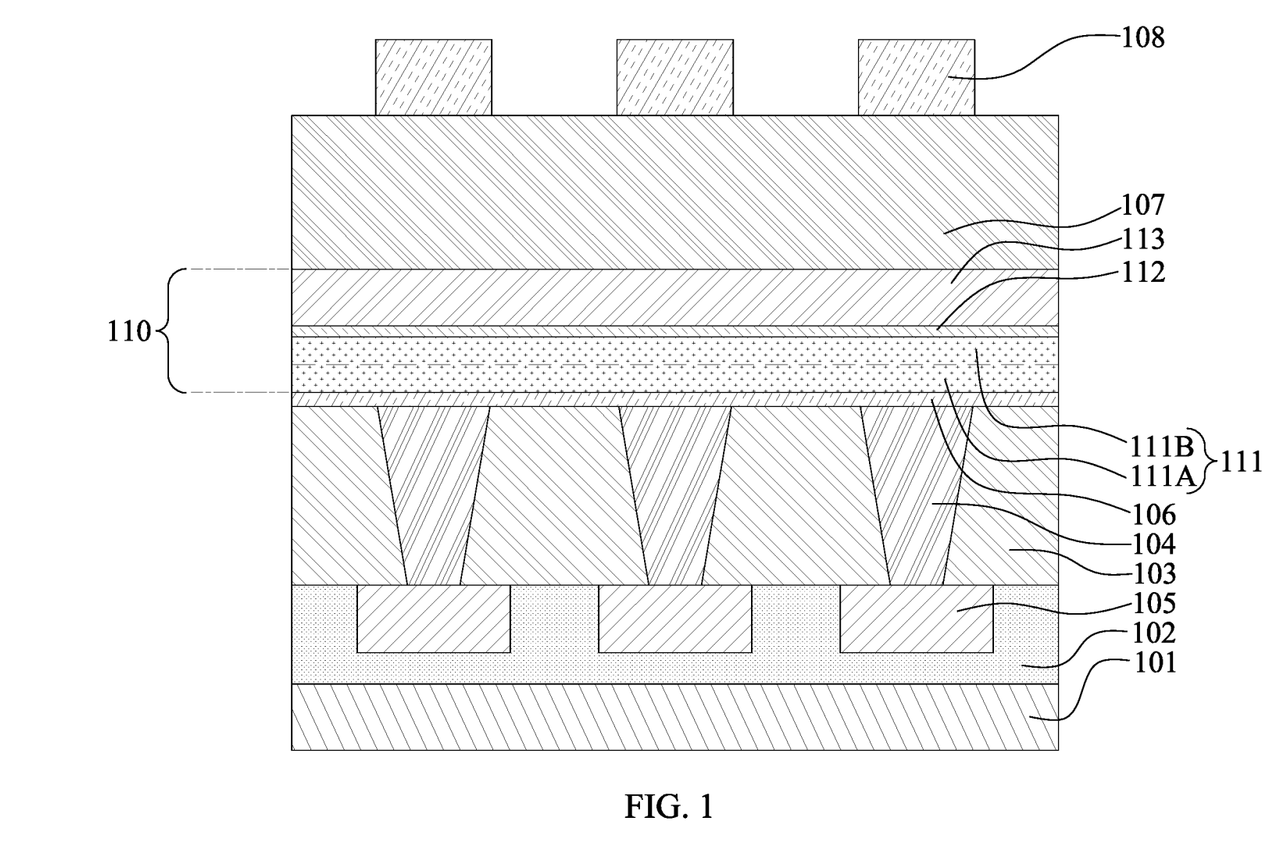
FIGS. 1 through 8 are cross-sectional views of intermediate stages in the formation of a semiconductor structure including magnetic tunnel junction (MTJ) pillars in accordance with some embodiments.
Figure 9:
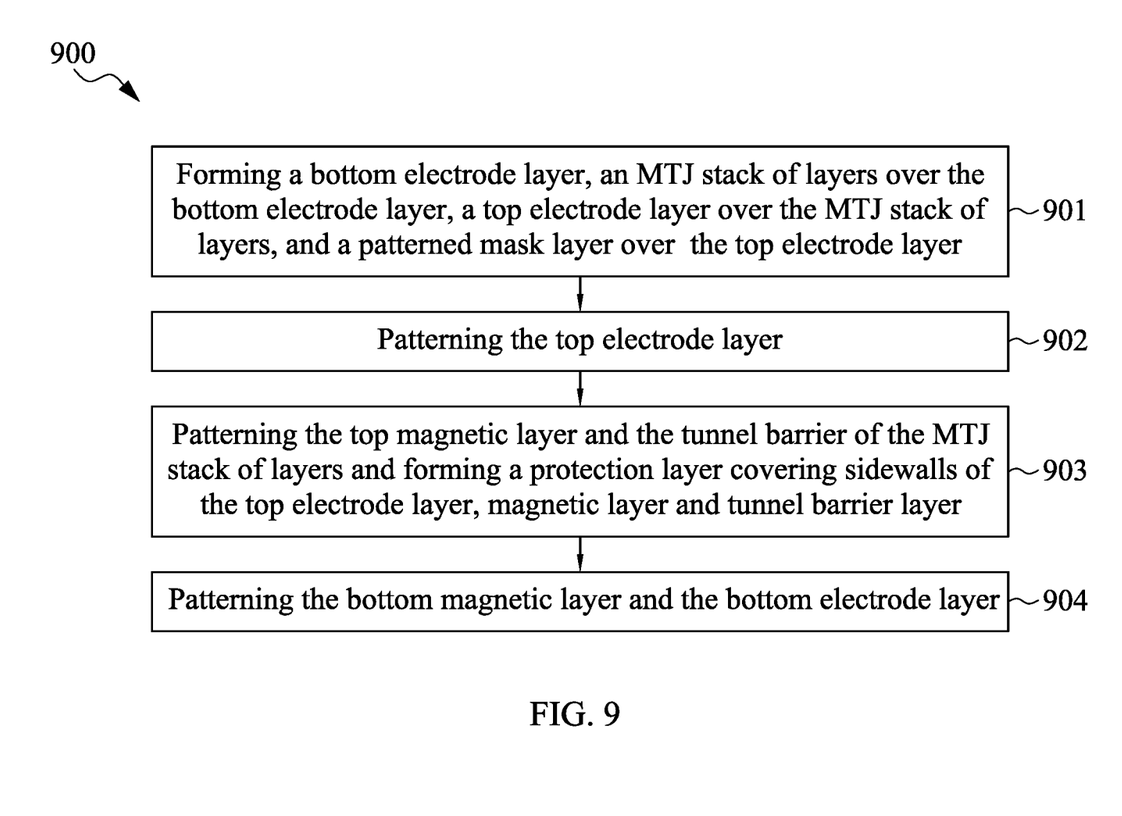
FIG. 9 shows a flowchart representing a method for forming magnetic tunnel junction (MTJ) pillars according to aspects of the present disclosure in one or more embodiments.

FIG. 1 illustrates a cross-sectional view of some embodiments corresponding to operation 901 shown in FIG. 9. As illustrated by FIG. 1, a dielectric layer 102 is provided over a substrate 101. The substrate 101 may be a semiconductor substrate formed of commonly-used semiconductor materials such as silicon (Si), silicon germanium (SiGe), gallium arsenide (GaAs), or the like, and may be a bulk substrate or a semiconductor-on-insulator (SOI) substrate. In some embodiments of the present disclosure, the dielectric layer 102 may be formed of low-κ dielectric material, for example, material with k value lower than about 3.0, or even lower than about 2.5, but the disclosure is not limited thereto. The dielectric layer 102 may also be formed of another dielectric material such as silicon oxide, silicon nitride, Phospho-Silicate Glass (PSG), Boro-Silicate Glass (BSG), Boron-Doped Phospho-Silicate Glass (BPSG), or the like, Conductive features 105 are formed in the dielectric layer 102. In some embodiments of the present disclosure, conductive features 105 are metal lines (such as word lines or bit lines), metal vias, contact plugs, doped semiconductor strips, or the like. Conductive features 105 may be formed of metals, such as copper, aluminum, tungsten, cobalt, or the like, or metal alloys thereof.

A dielectric layer 103 is provided over the conductive features 105 and the dielectric layer 102. In some embodiments, the dielectric layer 103 may include a plurality of layers of dielectric materials. In some embodiments, a plurality of bottom electrode vias (BEVAs) 104 are formed within the dielectric layer 103, The dielectric layer 103 may be formed of a TEOS oxide deposited using, e.g., a Chemical Vapor Deposition (CVD) method with Tetra Ethyl Ortho Silicate (TEOS) as a precursor. The dielectric layer 103 may be formed using PSG, BSG, BPSG, Undoped Silicate Glass (USG), Fluorosilicate Glass (FSG), SiOCH, flowable oxide, a porous oxide, or the like, or combinations thereof in accordance with other embodiments. The dielectric layer 103 may also be formed of a low-k dielectric material with a k value lower than about 3.0, for example. The BEVAs 104 may be formed of metals such as copper (Cu), aluminum (Al), tungsten (W), cobalt (Co), or the like, or alloys of the metals.

Referring further to FIG. 1, a bottom electrode layer 106 is formed over the dielectric layer 103, a magnetic tunnel junction (MTJ) stack of layers 110 is formed over the bottom electrode layer 106, and a top electrode layer 107 is formed over the MTJ stack of layers 110. In some embodiments of the present disclosure, the bottom electrode layer 106 is formed as a blanket layer, and may be formed using CVD, Physical Vapor Deposition (PVD), Electro-Chemical Plating (ECP), Electroless plating, or the like. The material of the top electrode 106 may include copper (Cu), aluminum (Al), titanium (Ti), tantalum (Ta), tungsten (W), platinum (Pt), nickel (Ni), chromium (Cr), ruthenium (Ru), titanium nitride (TiN), tantalum nitride (TaN), combinations thereof, multilayers thereof, or the like. In some embodiments wherein the bottom electrode layer 106 include multi-layers, the bottom electrode layer 106 may include a first layer and a second layer over the first layer, with a first layer being made of TaN and a second layer being made of TiN.

In some embodiments, the magnetic tunnel junction (MTJ) stack of layers 110 may include, for example, a first magnetic layer 111, a tunnel barrier layer 112 overlying the first magnetic layer 111, and a second magnetic layer 113 overlying the tunnel barrier layer 112. The first magnetic layer 111, the tunnel barrier layer 112 and the second magnetic layer 113 may be deposited using one or more deposition methods such as, CVD, PVD, atomic layer deposition (ALD), or the like. The first magnetic layer 111 is also referred to as bottom magnetic layer in the present disclosure. The second magnetic layer 113 is also referred to as top magnetic layer in the present disclosure.

In some embodiments, the first magnetic layer 111 may include a pinning layer 111A and a pinned layer 111B. The pinning layer 111A may be formed of a metal alloy including manganese (Mn) and another metal(s) such as platinum (Pt), iridium (Ir), rhodium (Rh), nickel (Ni), palladium (Pd), iron (Fe), osmium (Os), or the like. In some embodiments, the pinning layer 111A may be formed of PtMn, IrMn, RhMn, NiMn, PdPtMn, FeMn, Os, Mn, or the like. The pinned layer 111B may be formed of a ferromagnetic material with a greater coercivity field than the second magnetic layer 113, and may be formed of materials such as cobalt iron (CoFe), cobalt iron boron (CoFeB), or the like. In some embodiment, the pinned layer 111B has a Synthetic ferromagnetic (SFM) structure, in which the coupling between magnetic layers is ferromagnetic coupling. The first magnetic layer 111 may also adopt a Synthetic Antiferromagnetic (SAF) structure including a plurality of magnetic metal layers separated by a plurality of non-magnetic spacer layers. The magnetic metal layers may be formed of Co, Fe, Ni, or the like. The non-magnetic spacer layers may be formed of Cu, Ru, Ir, Pt, W, Ta, Mg, or the like. For example, the First magnetic layer 111 may have a Co layer and repeated $(Pt/Co)_x$ layers over the Co layer, with x representing repeating number and may be any integer equal to or greater than 1.

The tunnel barrier layer 112 may be formed of an oxide, such as a metal oxide. Example of the metal oxide includes, but is not limited to, magnesium oxide (MgO). The tunnel barrier layer 112 may have a thickness in the range between about 0.5 nm and about 3 nm.

The second magnetic layer 113 may include a free layer. In some embodiments, the second magnetic layer 113 may be formed of a ferromagnetic material such as CoFe, NiFe, CoFeB, CoFeBW, or the like. The second magnetic layer 113 may also adopt a synthetic ferromagnetic structure, which is similar to the SAF structure, with the thickness of the spacer layer adjusted to achieve the ferromagnetic coupling between the separated magnetic metals, i.e., causing the magnetic moment to be coupled in the same direction. The magnetic moment of the second magnetic layer 113 is programmable, and the resistance of the resulting MTJ cell is accordingly changed between a high resistance and a low resistance. It is realized that the materials and the structure of the MTJ stack of layers 110 may have many variations, which are also within the scope of the present disclosure.

The top electrode layer 107 is formed over the MTJ stack of layers 110. In some embodiments, the top electrode layer 107 is formed as a blanket layer, and may be formed using CVD, PVD, ECP, Eless plating, or the like. The material of the top electrode layer 107 may include copper (Cu), aluminum (Al), titanium (Ti), tantalum (Ta), tungsten (W), platinum (Pt), nickel (Ni), chromium (Cr), ruthenium (Ru), titanium nitride (TiN), tantalum nitride (TaN), combinations thereof, multi-layers thereof, or the like. In some embodiments, the top electrode layer 107 may include a conductive layer formed of TiN, Ta, TaN, Ti, Ru, W, Si, alloys thereof, and/or multi-layers thereof. The top electrode layer 107 may also include a dielectric layer over the conductive layer, and the dielectric layer may include titanium oxide, TEOS oxide, amorphous carbon, photo resist, or other suitable material. The top electrode layer 107 may be used as a hard mask in the subsequent patterning of MTJ layers.

A patterned mask layer 108 is formed over the top electrode layer 107 and used as an etching mask to etch the top electrode layer 107 and transfer a pattern thereto. In some embodiments, the patterned mask layer 108 may be used as an etching mask to etch the top electrode layer 107 and the underlying layers and transfer a pattern thereto. The patterned mask layer 108 define a pattern for forming MU pillars in the subsequent processes.

The method of the present disclosure includes a first patterning step by using a reactive ion etching to etch and pattern the second magnetic layer and the tunnel barrier layer. In some embodiments, the method of the present disclosure further includes a second patterning step by using an ion beam etching to etch and pattern the underlying first magnetic layer.

Figure 2:
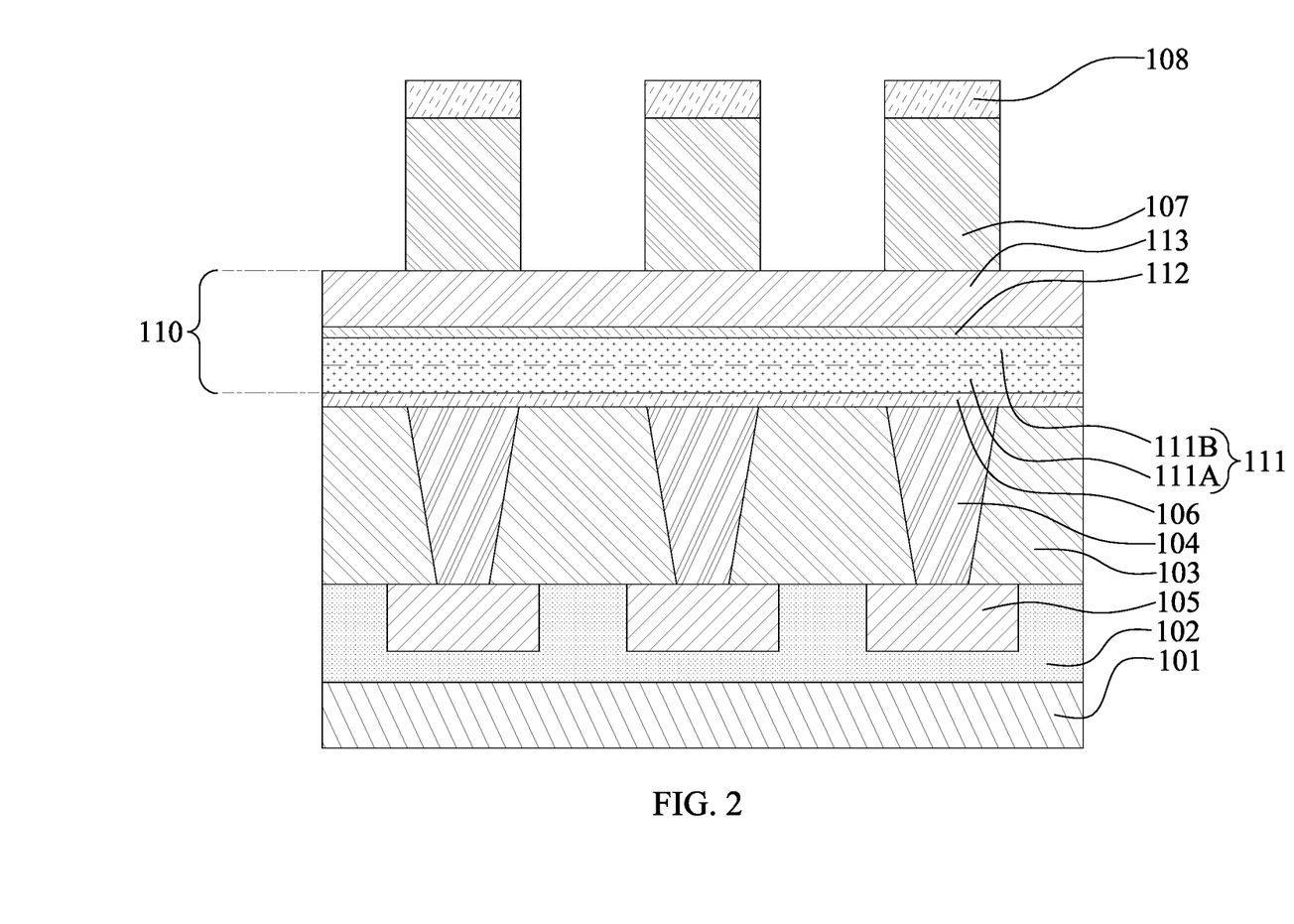
Figure 3:
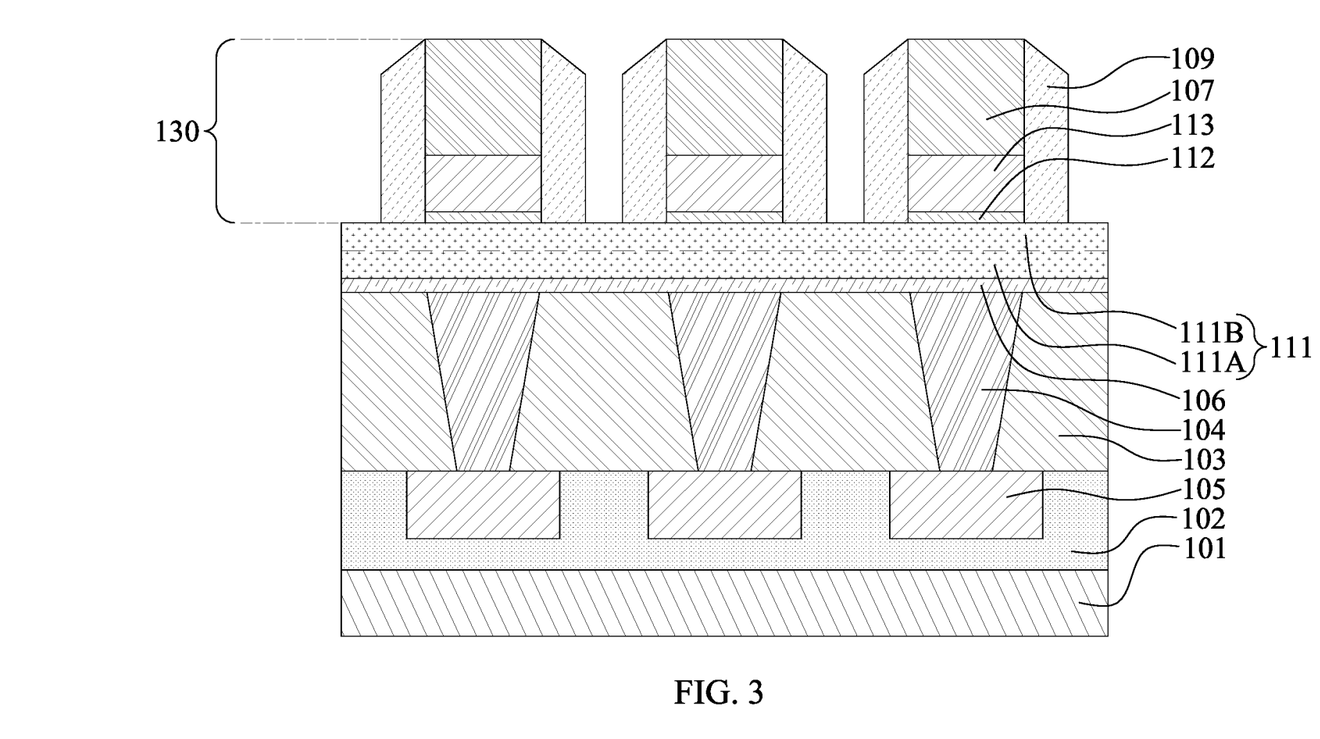

FIG. 2 illustrates the operation for patterning the top electrode layer 107. FIG. 3 illustrates the operation for patterning the top magnetic layer 113 and the tunnel barrier layer 112 of the MTJ stack, which includes carrying out the first patterning step. The respective operations are illustrated respectively as operation 902 and operation 903 shown in FIG. 9.

Referring to FIGS. 2 and 3, a patterning step is carried out to transfer the pattern of the patterned mask layer 108 to the top electrode layer 107 and the underlying layers (i.e., the second magnetic layer 113 and the tunnel barrier layer 112) to form one or more pillar structures 130. The resulting pillar structures include, from top to bottom: the top electrode layer 107, the second magnetic layer 113 and the tunnel barrier layer 112.

Referring to FIG. 2, the patterned mask layer 108 is used as an etching mask to etch the top electrode layer 107 and transfer its pattern to the top electrode layer 107. In some embodiments, the patterned mask layer 108 may be consumed during the operation of FIG. 2, and thus, there may be no or little patterned mask layer 108 remained on the top electrode layer 107 after the operation of FIG. 2. In some embodiments, the etching of the top electrode layer 107 can be carried out using RIE, IBE, atomic layer etching (ALE), and the like, and can be carried out before etching the underlying layers.

Referring to FIG. 3, the top electrode layer 107 and the patterned mask layer 108 (if any) remained on the top electrode layer 107 after the operation of FIG. 2 can be used as an etching mask to etch the second magnetic layer 113 and the tunnel harrier layer 112 and transfer the pattern thereto. During the operation of FIG. 3, the patterned mask layer 108 is exhausted and a portion of the top electrode layer 107 is consumed so the thickness of the top electrode layer 107 is reduced. The etching of the second magnetic layer 113 and the tunnel barrier layer 112 is carried out using RIE.

In some embodiments, the first patterning step includes etching the second magnetic layer 113 and the tunnel barrier layer 112 (FIG. 3) using RIE. In other embodiments, the first patterning step includes etching the top electrode layer 107 (FIG. 2) and etching the second magnetic layer 113 and the tunnel barrier layer 112 (FIG. 3) at the same time using RIE.

Referring to FIG. 3, in the first patterning step of the method of the present disclosure, RIE with specific process gases is used to etch the second magnetic layer 113 and the tunnel barrier layer 112 and form a protection layer 109 which covers at least sidewalls of the tunnel barrier layer 112 of the resulting pillar structures. In some embodiments, the first patterning step includes using a first process gas for etching and then using a second process gas for performing polymer deposition to form a protection layer. In some embodiments, the first process gas may have a relatively high ratio of fluorine (F) to carbon (C) ("F/C ratio") than the second process gas such that the etching and polymer deposition can be implemented respectively using the first process gas and the second process gas.

The process gas used in the RIE for etching is referred to as "etching gas." In some embodiments, the etching gas may have an F/C ratio of 2 or more, 3 or more, or 4 or more. The etching gas may include one or more of the following chemical substances: methane ($CH_4$) and fluorocarbons (e.g., $CH_3F$, $CH_2F_2$, $CHF_3$ or $CF_4$). In some embodiments, the etching gas may further include $O_2$. In some embodiments, $Si_xCl_y$, $Si_xF_y$, $Si_xBr_y$, $Si_xI_y$, $Cl_2$, $Br_2$, and/or an inert gas such as He, Ar, Kr, Ne or Xe may also be included in the etching gas. In some embodiments, the etching gas may include $CF_4$ and $Si_xCl_y$. In some embodiments, the etching gas may include $CF_4$, $Si_xCl_y$, Ar and $O_2$. The gases included in the etching gas may be used simultaneously or sequentially depending on the operation condition and the material of the layer to be etched.

After the etching of the tunnel barrier layer is completed, a process gas having a chemical composition different from the etching gas is used to perform polymer deposition to form the protection layer 109. The process gas used in the RIE for polymer deposition is referred to as "deposition gas." In some embodiments, the deposition gas may have an F/C ratio of 2 or less, 1 or less, or 0 and the deposition gas may include one or more of the following chemical substances: methane ($CH_4$) and fluorocarbons (e.g., $CH_3F$, $CH_2F_2$, $CHF_3$ or $CF_4$). In some embodiments, the deposition gas may further include $O_2$. In some embodiments, an inert gas such as He, Ar, Kr, Ne or Xe may also be included in the deposition gas. In some embodiments, the deposition gas may include $CH_4$. In some embodiments, the etching gas may include $CH_4$ and $O_2$. The gases included in the etching gas may be used simultaneously or sequentially depending on the operation condition and the material of the layer to be etched.

In some embodiments, the tunnel barrier layer and the second magnetic layer overlying the tunnel barrier layer are etched by carrying out a chemical treatment, e.g., RIE, using a process gas containing fluorocarbon to etch the tunnel barrier layer. In some embodiments, the process gas containing fluorocarbon contains one or more of the following substance: $CH_3F$, $CH_2F_2$, $CHF_3$ or $CF_4$. In some embodiments, the process gas containing fluorocarbon may further contain methane ($CH_4$).

The protection layer 109 thus-obtained has polymer-rich chemistry. In some embodiments, the protection layer 109 contains carbon (C), Hydrogen (H), and Oxygen (O). In some embodiments, the protection layer 109 contains carbon (C), Hydrogen (H), Oxygen (O) and elements from the etched layers. In some embodiments, the protection layer 109 may contain a trace amount of fluorine (F). The protection layer covers at least sidewalls of the tunnel barrier layer 112 of the pillar structures. In some embodiments, the protection layer 109 covers sidewalls of the second magnetic layer 113 and tunnel barrier layer 112 of the pillar structures. In some embodiments, the protection layer 109 covers sidewalls of the top electrode layer 107, the second magnetic layer 113 and the tunnel barrier layer 112 of the pillar structures.

In some embodiments, the RIE is performed with the source power in the range between about 50 Watts and about 3,000 Watts. The bias voltage may be in the range between about 0 volts and about 1,500 volts.

The protection layer not only prevents the tunnel barrier layer from either chemical damage or damage from ion bombardment, but also functions as an insulation layer isolating the tunnel barrier layer from metal redeposition that may occur during etching underlying layers. Therefore, the shorting issue can be mitigated and the performance of the MTJ stack is improved. In addition, in some embodiments, with the use of RIE to etch the top electrode layer, the top magnetic layer and the tunnel barrier layer of the MTJ pillar structures, the aspect ratio of the MTJ pillar structures can be reduced due to the selectivity of RIE and the shadowing effects for the following patterning step can be reduced.

Figure 4:
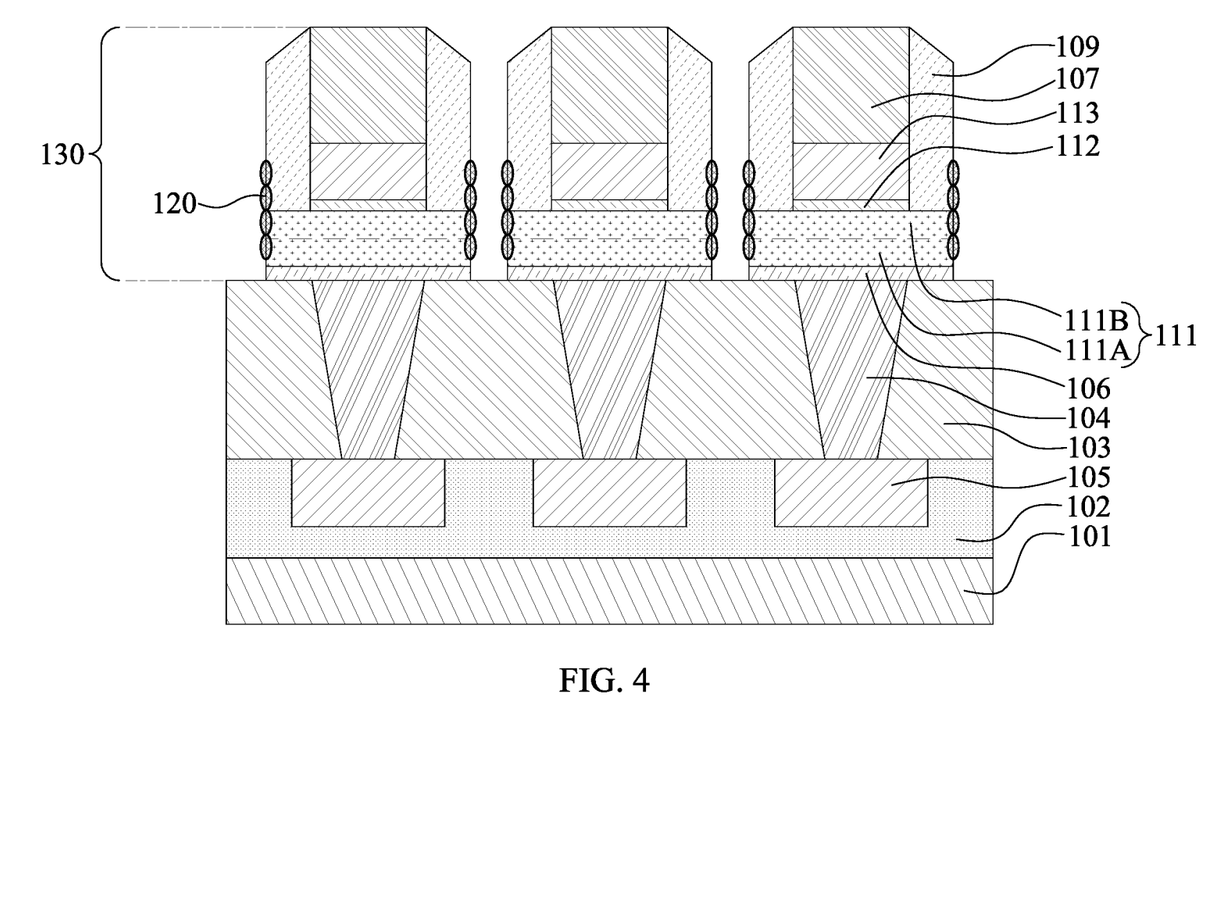
Figure 5:
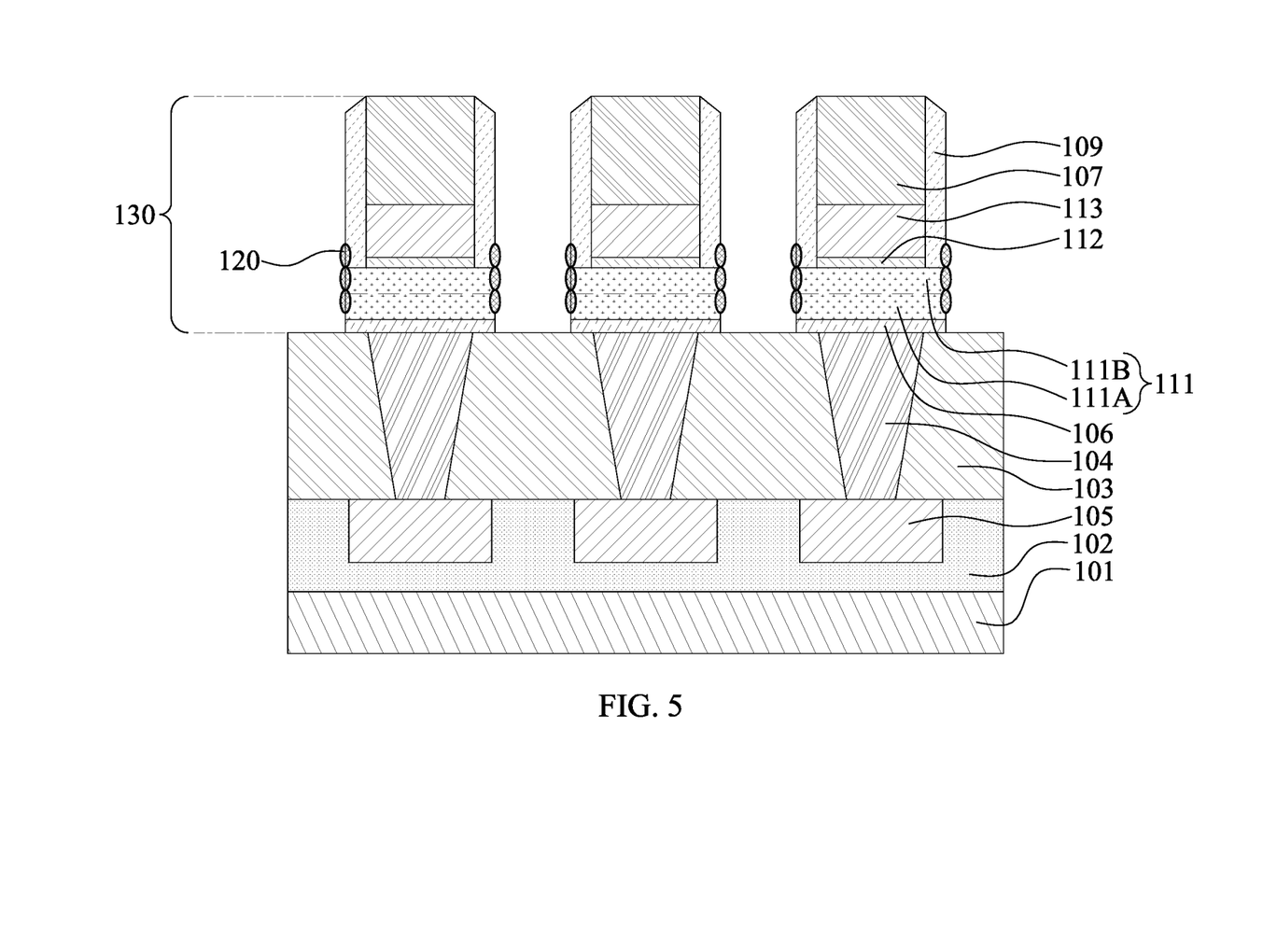

FIGS. 4 and 5 illustrate operations involved in the second patterning step, which includes operation carried out at an etching stage and operation carried out at a trimming stage. The respective operations are illustrated as operation 904 shown in FIG. 9.

The second patterning step is carried by using IBE and includes an etching stage followed by a trimming stage. The ME is performed with the source power in the range between about 50 Watts and about 2,000 Watts. The beam voltage may be in the range between about 50 volts and about 2,000 volts.

Referring to FIG. 4, at the etching stage of the second patterning step, the first magnetic layer 111 is etched such that the pillar structures 130 formed in the first patterning step extend downwardly to include the first magnetic layer III. The resulting pillar structures 130 thus includes, from top to bottom: the top electrode layer 107, the second magnetic layer 113, the tunnel barrier layer 112 and the first magnetic layer 111. In some embodiments, the bottom electrode layer 106 is also etched at the etching stage of the second patterning step and the resulting pillar structures 130 thus includes, from top to bottom: the top electrode layer 107, the second magnetic layer 113, the tunnel barrier layer 112, the first magnetic layer 111, and the bottom electrode layer 106. In some embodiments, an inert gas, such as He, Ar, Kr, Ne, Xe or combinations thereof, is used as the etching gas for the second patterning step.

In some embodiments, during the etching of the first magnetic layer 111 and the bottom electrode layer 106, a portion of the first magnetic layer 111 and the bottom electrode layer 106 is removed by IBE, which may lead to the creation of the conductive particles 120 and the deposition of the conductive particles 120 on the sidewalls of the MTJ pillar structures 130. The conductive particles 120 include the materials of the first magnetic layer 111 and the bottom electrode layer 106. Due the presence of the protection layer 109, the conductive particles 120 produced at the second patterning step are deposited on the sidewalls of the protection layer 109 and isolated from the tunnel barrier layer 112 by the sidewalls of the protection layer 109 and thus the electric shorting caused by metal redeposition found in the conventional etching processes can be avoided.

In some embodiments, during the etching of the bottom electrode layer 106, when the bottom electrode layer 106 is etched-through and the underlying dielectric layer 103 is exposed, signal of the elements in the dielectric layer 103 can be detected and then an over-etching is performed. The dielectric layer 103 may be recessed (not shown in FIGS. 4 and 5).

Referring to FIG. 5, a trimming stage of the second patterning step is carried out to clean the sidewalls of the MTJ pillars 130 (especially the sidewall of the first magnetic layer 111). The protection layer 109 is thinned during the etching stage and/or trimming stage of the second patterning step and thus has a smaller thickness.

When the MTJ pillars are densely-arranged and have a high aspect ratio, the shadowing effect becomes more prominent which makes it difficult to efficiently etch the layers below the tunnel barrier layer using IBE while attempting to lower metal redeposition on the tunnel barrier layer. In the method of the present disclosure, RIE is used for etching the tunnel barrier layer and the overlaying magnetic layer and a protection layer is formed to cover at least the sidewall of the tunnel barrier layer, and therefore, the aspect ratio of MTJ pillars can be reduced due to the selectivity of the RIE and the shadowing effect for the following IBE can be reduced. The method according to the present disclosure can be implemented for preparing smaller NM pillars, especially when scaled down to 40 nm or below, with a relatively row aspect ratio. In some embodiments, the aspect ratio can be reduced to 3.5 or below. 3.0 or below or 2.5 or below, or preferably to 2.0 or below.

Furthermore, the density of the MTJ pillars in different areas of an integrated circuit may be different, which results in difference in the etching process. The differences which arise due to variations in density are referred to as I/D loading. As compared to the existing technique, in some embodiments of the present disclosure, the I/D loading can be improved without additional steps.

Figure 6:
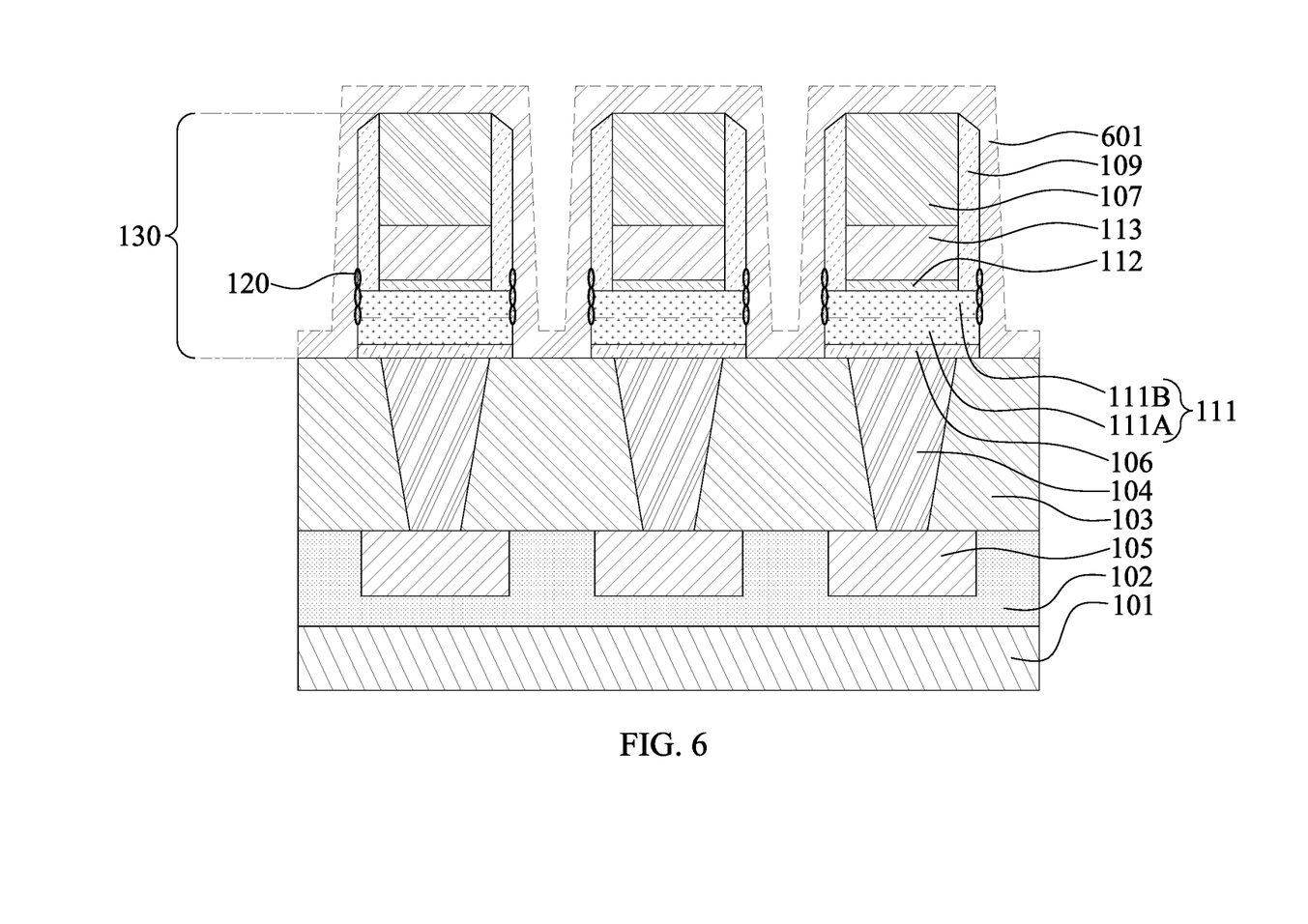
Figure 7:
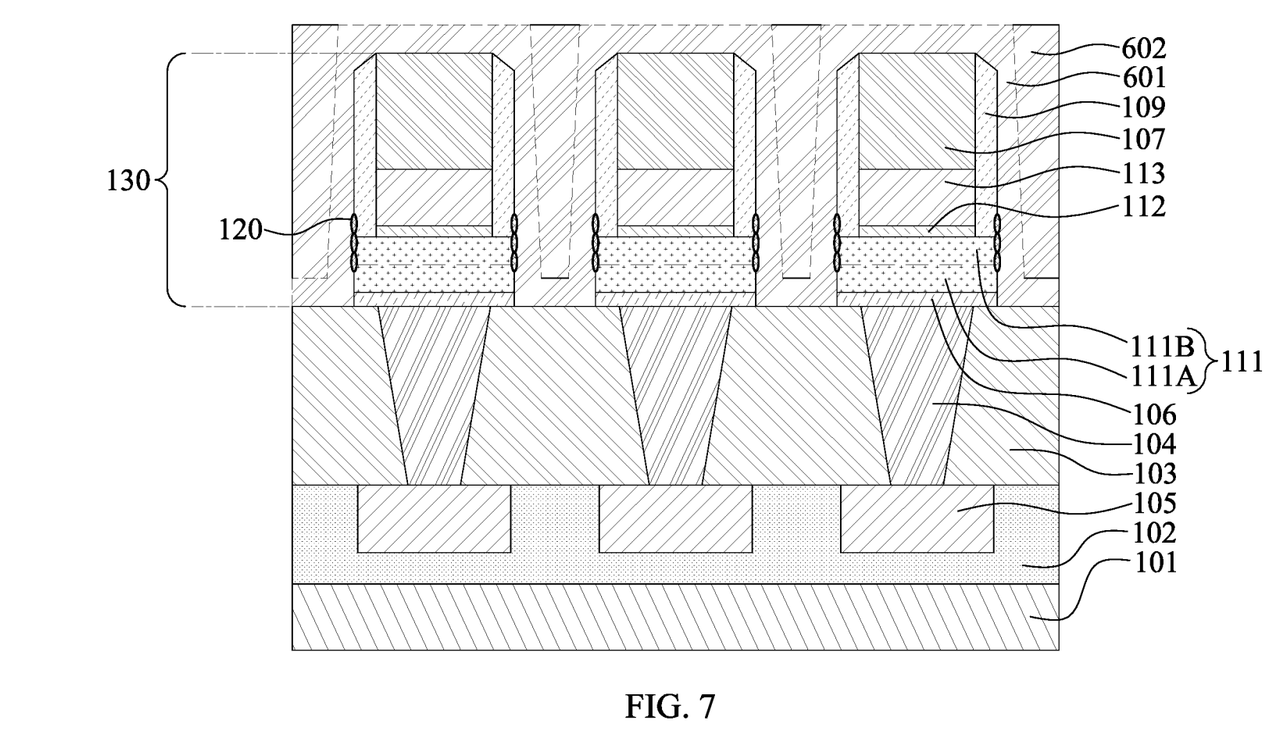

FIG. 6 illustrates the formation of a cap dielectric layer 601. In some embodiments of the present disclosure, the cap dielectric layer 601 is formed of silicon nitride, silicon oxynitride, or the like. The formation process may be a CVD process, an ALD process, a Plasma Enhance CVD (PECVD) process, or the like. The cap dielectric layer 601 has the function of protecting MTJ and the bottom and top electrodes from being degraded by detrimental substance such as chemicals and moisture. In some embodiments, the cap dielectric layer 601 may be skipped. Accordingly, the cap dielectric layer 601 is illustrated using dashed lines to indicate that it may be or may not be formed. Skipping the cap dielectric layer 601 has the advantageous features of leaving more spaces for the subsequent gap-filling process as shown in FIG. 7, and the gap-filling is more reliable to fill the gaps fully. This also results in the possibility of further shrinking the pitches of the MRAM cells.

FIG. 7 illustrates a gap-filling process, in which a dielectric layer 602 is filled into the gaps between MTJ pillars 130. The dielectric layer 602 may be a TEOS oxide. PSG, BSG, BPSG, USG, FSG, SiOCH, flowable oxide, a porous oxide, or the like, or combinations thereof. The dielectric layer 602 may also be formed of a low-k dielectric material. The formation method may include CVD, PECVD, ALD, FCVD, spin-on coating, or the like. After the gap-filling process, a planarization process such as a CMP process or a mechanical grinding process may be performed. The planarization process may be stopped on the top surface of the cap dielectric layer 601 or the top surfaces of the top electrodes 107.

Figure 8:
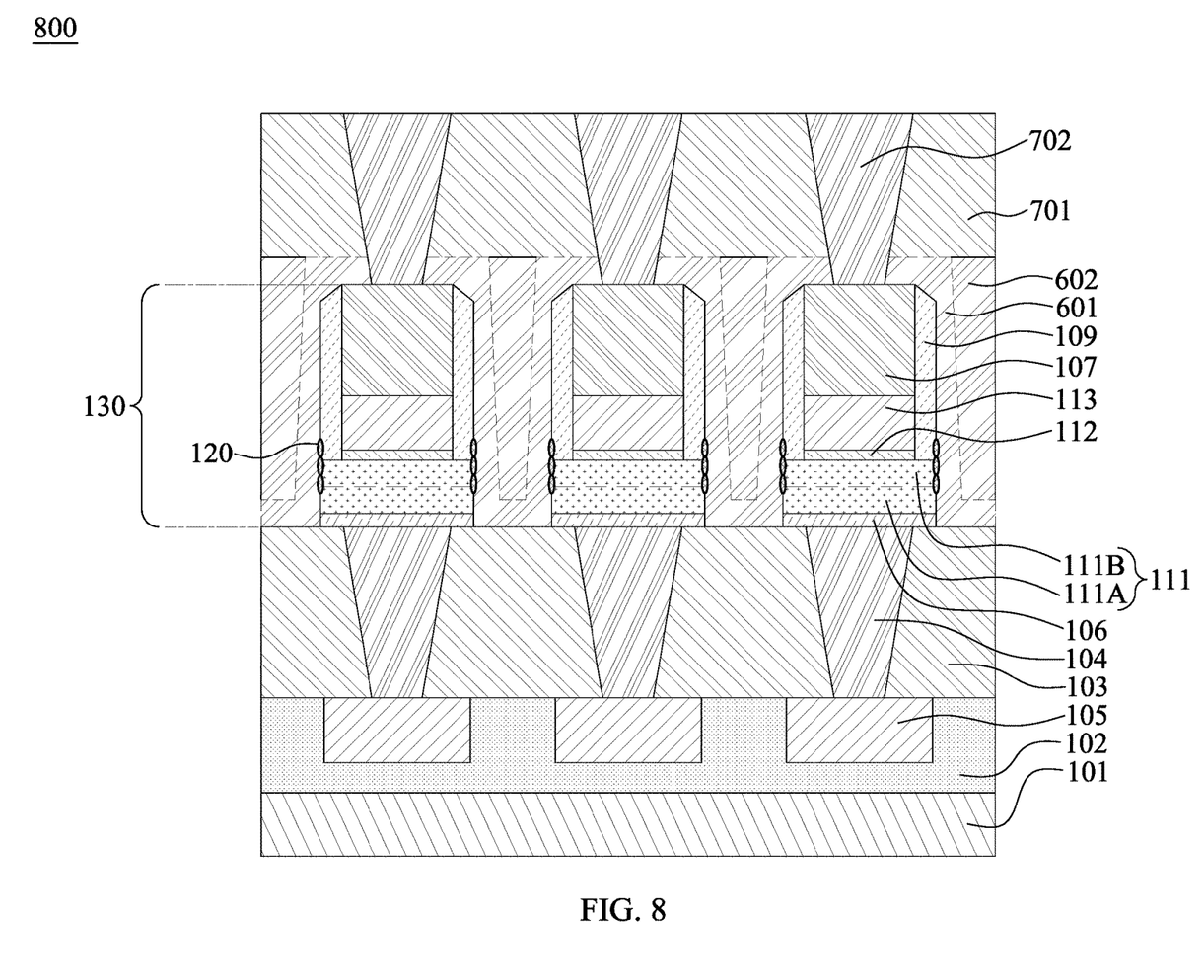

FIG. 8 illustrates the structure after the formation of conductive features 702, which may be vias, conductive lines (such as word lines or bit lines), or the like. Conductive features 702 may be formed of metals such as copper, aluminum, tungsten, cobalt, or the like, or alloys of the metals. In some embodiments, conductive features 702 includes top electrode vias (TEVAs) formed in a dielectric layer 701 and penetrate through the dielectric portions (if any) of the top electrodes 107 to contact the top electrodes 107.

As illustrated in FIGS. 1 through 8, a novel semiconductor structure 800 can be produced. The semiconductor structure 800 includes an MTJ pillar. As shown in FIG. 8, The MTJ pillar 130 includes a first magnetic layer 111, a tunnel barrier layer 112 overlying the first magnetic layer 111, a second magnetic layer 113 overlying the tunnel barrier layer 112, and a protection layer 109. The protection layer 109 is disposed above the first magnetic layer 111 and surrounds the tunnel barrier layer 112 and the second magnetic layer 113. The magnetic tunneling junction (MTJ) pillar further includes a top electrode layer 107 overlying the second magnetic layer 113 and the protection layer 109 surrounds the top electrode layer 107. The protection layer has polymer-rich chemistry and may contain C, H, and O. In some embodiments, the protection layer may further include elements from the etched layers (e.g., the tunnel barrier layer 112 and the second magnetic layer 113). In some embodiments, the protection layer 109 may contain a trace amount of F.

FIG. 9 illustrates a flowchart of a method 900 for forming magnetic tunnel junction (MTJ) pillars in accordance with some embodiments of the present disclosure. In some embodiments, the method 900 begins with operation 901 in which a bottom electrode layer (such as the bottom electrode 106 illustrated in FIG. 1), an MTJ stack of layers (such as the MTJ layers 110 illustrated in FIG. 1) over the bottom electrode layer, a top electrode layer (such as the top electrode 107 illustrated in FIG. 1) over the MTJ stack of layers and a patterned mask layer over the top electrode layer (such as the patterned mask layer 108 illustrated in FIG. 1), are formed. The MTJ stack of layers include, for example, a first magnetic layer 111 (also referred to as bottom magnetic layer in the present disclosure), a tunnel barrier layer 112 overlying the first magnetic layer, and a second magnetic layer 113 (also referred to as top magnetic layer in the present disclosure) overlying the tunnel barrier layer 112 as described above with reference to FIG. 1, In operation 902, the top electrode layer is patterned. In operation 903, the top magnetic layer 113 and tunnel barrier layer 112 of the MTJ stack of layers are patterned and a protection layer 109 covering sidewalls of the top electrode layer 107, top magnetic layer 113 and tunnel barrier layer 112 is formed as described above with reference to FIGS. 2 and 3. In operation 903, the bottom magnetic layer 111 of the MTJ stack of layers and the bottom electrode layer 106 are patterned as described above with reference to FIGS. 4 through 5.

Accordingly, the present disclosure provides a method for forming MTJ pillars and a method for forming a semiconductor structure including MTJ pillars. In the method of the present disclosure, RIE with specific etching gas is carried out for etching the tunnel barrier layer and the overlaying magnetic layer, followed by carrying out IBE for etching the underlying layers. A protection layer is formed and covers the sidewall of the tunnel barrier layer during RIE. Due the presence of the protection layer, the issue of metal deposition from the etching of the underlying magnetic layer and bottom electrode can be avoided and the protection layer can protect the tunnel barrier layer from chemical damage or damage caused by ion bombardment. Therefore, the aspect ratio of MTJ pillars can be reduced, smaller MTJ pillars can be formed, the shadowing effect for the following IBE can be reduced, and the loading can be improved without additional steps. Consequently, the performance of the MTJ stack and the semiconductor structure including the same can be improved.

In some embodiments, a method for fabricating magnetic tunnel junction (MTJ) pillars is provided. The method includes following operations. A MTJ stack of layers includes a first magnetic layer, a tunnel barrier layer overlying the first magnetic layer, and a second magnetic layer overlying the tunnel barrier layer is provided. A first patterning step is carried out by using a reactive ion etching. In the first patterning step, the second magnetic layer and the tunnel barrier layer are etched to form one or more pillar structures and a protection layer is formed and covers sidewalls of the pillar structures.

In some embodiments, a method for fabricating a semiconductor structure is provided. The method includes following operations. A magnetic tunneling junction (MTJ) stack of layers is provided. The MTJ stack of layers includes a first magnetic layer, a tunnel barrier layer overlying the first magnetic layer, and a second magnetic layer overlying the tunnel barrier layer. A chemical treatment is carried out by using a fluorocarbon-containing process gas to etch the tunnel barrier layer.

In some embodiments, a semiconductor structure is provided. The semiconductor structure includes a magnetic tunneling junction (MTJ) pillar and a protection layer. The magnetic tunneling junction (MTJ) pillar includes a first magnetic layer, a tunnel barrier layer overlying the first magnetic layer, a second magnetic layer overlying the tunnel barrier layer. The protection layer disposed above the first magnetic layer and surrounds the tunnel barrier layer and the second magnetic layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein.

What is claimed is:

1. A method for fabricating magnetic tunnel junction (MTJ) pillars, the method comprising:
   providing a magnetic tunneling junction (MTJ) stack of layers, wherein the MTJ stack of layers comprising a first magnetic layer, a tunnel barrier layer overlying the first magnetic layer, and a second magnetic layer overlying the tunnel barrier layer;
   carrying out a first patterning step by using a reactive ion etching, wherein the second magnetic layer and the tunnel barrier layer are etched to form one or more pillar structures and a protection layer is formed and covers sidewalls of the pillar structures, wherein the first patterning step comprises using a first process gas for etching and then using a second process gas for forming the protection layer, and
   carrying out a second patterning step by using an ion beam etching, wherein the first magnetic layer is etched such that the pillar structures formed in the first patterning step extend downwardly and include the etched first magnetic layer.

2. The method of claim 1, wherein the first process gas has a relatively high ratio of fluorine (F) to carbon (C) than the second process gas.

3. The method of claim 1, wherein the first process gas includes one or more of the following chemical substances: $CH_4$, $CH_3F_2$, $CHF_3$ and $CF_4$.

4. The method of claim 3, wherein the first process gas used in the first patterning step further comprises $O_2$.

5. The method of claim 3, wherein the first process gas used in the first patterning step further comprises one or more of the following chemical substances:
   $Si_xcl_y$, $Si_xF_y$, $Si_xI_y$, $Cl_2$, $Br_2$ and an inert gas.

6. The method of claim 1, wherein the second process gas includes one or more of the following chemical substances: $CH_4$, $CH_3F$, $CH_2F_2$, $CHF_3$ and $CF_4$.

7. The method of claim 6, wherein the second process gas used in the first patterning step further comprises $O_2$.

8. The method of claim 6, wherein the second process gas used in the first patterning step further comprises an inert gas.

9. The method of claim 1, wherein the protection layer has polymer-rich chemistry.

10. The method of claim 1, wherein the stack of MT layers is provided over a bottom electrode and the bottom electrode is etched together with the first magnetic layer in the second patterning step.

11. The method of claim 1, wherein a top electrode layer is provided over the second magnetic layer and the top electrode is etched together with the second magnetic layer and the tunnel barrier layer in the first patterning step.

12. The method of claim 1, wherein the protection layer comprises fluorine (F).

13. A method for fabricating a semiconductor structure, the method comprising:
   providing a magnetic tunneling junction (MTJ) stack of layers, wherein the MTJ stack of layers comprising a first magnetic layer, a tunnel barrier layer overlying the first magnetic layer, and a second magnetic layer overlying the tunnel barrier layer;
   carrying out a chemical treatment using a process gas containing fluorocarbon to etch the tunnel barrier layer,
   forming a protection layer covering sidewalls of the tunnel barrier layer, wherein the protection layer comprises carbon (C), hydrogen (H), and oxygen (O),
   patterning the first magnetic layer to create conductive particles,
   depositing the conductive particles on the protection layer, and
   forming a cap dielectric layer over the conductive particles.

14. The method of claim 13, wherein carrying out a chemical treatment comprises:
   carrying out a chemical treatment using a process gas containing fluorocarbon to etch the tunnel barrier layer and the second magnetic layer overlying the tunnel barrier layer.

15. The method of claim 13, wherein the protection layer comprises fluorine (F).

16. A method for fabricating a memory device, the method_comprising:
   forming a magnetic tunneling junction (MTJ) stack of layers over a bottom electrode layer, wherein the MTJ stack of layers comprises a bottom magnetic layer, a tunnel barrier layer overlying the bottom magnetic layer, and a top magnetic layer overlying the tunnel barrier layer;
   forming a top electrode layer over the MTJ stack of layers;
   patterning the top electrode layer, the top magnetic layer and the tunnel barrier layer;
   forming a protection layer over sidewalls of the top electrode layer, the top magnetic layer and the tunnel barrier layer, wherein the protection layer comprises carbon (C), hydrogen (H), and oxygen (O);
   patterning the bottom magnetic layer and the bottom electrode layer to create conductive particles,
   depositing the conductive particles on the protection layer, and
   forming a cap dielectric layer over the conductive particles.

17. The method of claim 16, wherein patterning the top electrode layer is carried out prior to patterning the top magnetic layer and the tunnel barrier layer.

18. The method of claim 16, wherein patterning the top electrode layer and patterning the top magnetic layer and the tunnel barrier layer are carried out at the same time.

19. The method of claim 16, Wherein patterning the top electrode layer, the top magnetic layer and the tunnel barrier layer is carried out by reactive ion etching.

20. The method of claim 16, wherein the protection layer comprises fluorine (F).

\* \* \* \* \*